United States Patent [19]
Green

[11] Patent Number: 5,010,340
[45] Date of Patent: Apr. 23, 1991

[54] CHARGE DOMAIN SUCCESSIVE APPROXIMATION ANALOG TO DIGITAL CONVERTER

[75] Inventor: Paul E. Green, La Mirada, Calif.

[73] Assignee: Rockwell International Corporation, El Segundo, Calif.

[21] Appl. No.: 498,788

[22] Filed: Mar. 26, 1990

[51] Int. Cl.⁵ ............................................. H03M 1/38
[52] U.S. Cl. .................................... 341/172; 341/155; 341/161
[58] Field of Search ............... 341/133, 158, 161, 165, 341/172, 155, 156, 166; 357/24

[56] References Cited

U.S. PATENT DOCUMENTS

| | | | |
|---|---|---|---|
| 4,136,335 | 1/1979 | Tompsett | 341/172 |
| 4,206,446 | 6/1980 | Rockett, Jr. | 341/172 |
| 4,329,679 | 5/1982 | Jensen | 341/172 |
| 4,375,059 | 2/1983 | Schlig | 341/162 |
| 4,471,341 | 9/1984 | Sauer | 341/161 |

Primary Examiner—J. R. Scott
Assistant Examiner—Brian Young
Attorney, Agent, or Firm—H. Fredrick Hamann; George A. Montanye; David J. Arthur

[57] ABSTRACT

A charge based analog to digital converter includes a plurality of charge storage elements, each having a charge receive mode and a charge expel mode, and were in each of the charge storage elements is configured for storing a predetermined amount of charge. There is preferably a two to one ratio between the storage capacity of adjacent charge storage elements. A comparator includes a sensing diffusion connected to all of the charge storage elements. The comparator produces a "0" bit if the sensing diffusion is in a first condition, and a "1" bit if the sensing diffusion is in a second condition. Selection electronics connected to the charge storage elements selectively and successively set the individual charge storage elements in the charge expel mode to successively test the charge quantity stored in each charge storage element by the initial analog charge packet.

18 Claims, 4 Drawing Sheets

CHARGE DOMAIN SUCCESSIVE APPROXIMATION ANALOG TO DIGITAL CONVERTER The invention herein described was made in the course of and/or under Contract DASG60-86-C-0095 with the Department of the Army.

BACKGROUND OF THE INVENTION

The present invention is an analog to digital converter for converting an analog charge based signal to a digital representation of the analog signal.

Conventional low-speed analog to digital converters operate by comparing a sampled analog voltage to a reference voltage, and adjusting the reference voltage until a null output is obtained. The digital device used to adjust the reference voltage is then decoded and read out as the digital equivalent. The reference voltage source used requires ultra-precision resistors, and dissipates power.

A typical successive-approximation analog to digital converter (A/D) is shown in block diagram form in FIG. 1. The input signal, usually held at a fixed level by a sample and hold circuit 31, is compared against the output of a digital to analog converter (D/A) 33. This is accomplished by inputting the sample and hold output and the D/A output into a differencing amplifier 35 and the amplifier output into a comparator 37.

At sample input time, the serial shift register and the bit latch 39 are set to all "0" by the control logic 41. The clock then advances the control logic at a fixed rate. The control logic shifts a "1" through the serial shift register. The control logic also, in combination with the comparator, sets the bit latch. The output from the shift register is ORed with the bit latch to control the D/A converter.

The A/D converter is exercised starting with the Most Significant Bit (MSB). The MSB is activated in the D/A by the shift register, causing comparison of the input against a ½ of full scale value. If the differencing amplifier output to the comparator indicates that the held input sample is more than ½ of full scale, as shown by the comparator 37, the MSB is left "ON", and a "1" is recorded in the bit latch for the MSB. If the differencing amplifier output to the comparator indicates that the input sample is less than ½ of full scale, the MSB is turned "OFF", and a "0" is recorded in the bit latch for the MSB.

The exercising of the A/D continues in order of descending bit weight, each bit weight being equal to ½ of the previous bit. Each bit weight is individually compared to the input sample via the D/A by summation with the D/A's output of the previous bits, if they were left "ON". The comparator therefore must be able to resolve a difference equal to the least significant bit.

FIG. 2 shows the bit weighting scheme of the typical A/D converters. The analog input signal is almost ⅔ of full scale. The MSB test produced a "1" for greater than half. This caused the D/A to be left "ON" for the MSB. The second bit equal to a ¼ caused overflow and was set to "0" causing the D/A to be turned off for that bit. The third bit equal to ⅛ produced a "1" for a D/A sum less than the input so the D/A was left on. The fourth bit equal to a 1/16 caused overflow and was set to "0", causing the D/A to be turned off for that bit. The fifth bit equal to 1/32 produced a "1" for a D/A sum less than the input so the D/A was left "ON". The resultant output binary code was therefore 10101. The digital result can be serially output as each bit is evaluated or parallel output from the stored results. Accuracy, linearity, and speed are primarily affected by the properties of the D/A converter and the comparator.

The invention is particularly suited to converting the analog signals received from individual infrared detectors of a focal plane array to a digital form for processing by digital signal processing electronics. In that application, the output of a detector is an analog charge domain signal. This signal is sampled to produce a charge packet. Conventional voltage based analog to digital converters require that the charge packet analog signal be converted to a voltage prior to being input to the analog to digital converter. The charge packet to voltage conversion process is non-linear, and the voltage must be corrected following conversion.

Furthermore, in the infrared detector application, the signal processing electronics, including any charge to voltage and analog to digital converters, are frequently placed adjacent the detector array. Therefore, heat generated in the conversion processes may be transferred to the detectors, interfering with their operation.

The invention is also generally suitable for use with signals produced by charge coupled devices (CCD's) or other sources of charge domain signals.

The invention is further suitable for use with a voltage input, as the conversion from voltage to charge can be made quite linear.

SUMMARY OF THE INVENTION

The present invention is a low power consumption device and method for directly converting a charge domain analog signal to a digital representation.

The method of the invention includes receiving a charge packet representative of a signal amplitude, and storing the charge packet in a plurality of charge storage wells, each having a predetermined relative storage capacity. The charge is distributed proportionally among the charge storage wells. The charge in the first storage well is unloaded onto a sensing diffusion connected to the storage wells and into the other storage wells, and a comparator connected to the sensing diffusion is sampled. If the comparator does not sense an overflow condition, a "0" is recorded for the first bit of the digital representation, and the well is left unloaded. The charge is subsequently unloaded from a second of the storage wells onto the sensing diffusion and the other charge storage wells, but not onto the first charge storage well. If, during the first sampling step, the comparator senses an overflow condition, a "1" is recorded for the first bit of the digital representation, and the well is returned to the store charge state. The charge is subsequently unloaded from the second storage well onto the sensing diffusion and the other charge storage wells, including the first storage well. The comparator is sampled a second time, and if the first condition is sensed, a "0" is recorded for the second bit of the digital representation, and the well is left unloaded. If the second condition is sensed, a "1" is recorded for the second bit of the digital representation, and the well is returned to store charge. This process is repeated until all bits have been sampled.

DETAILED DESCRIPTION OF THE PREFERRED EMBODIMENTS

Figure 3:
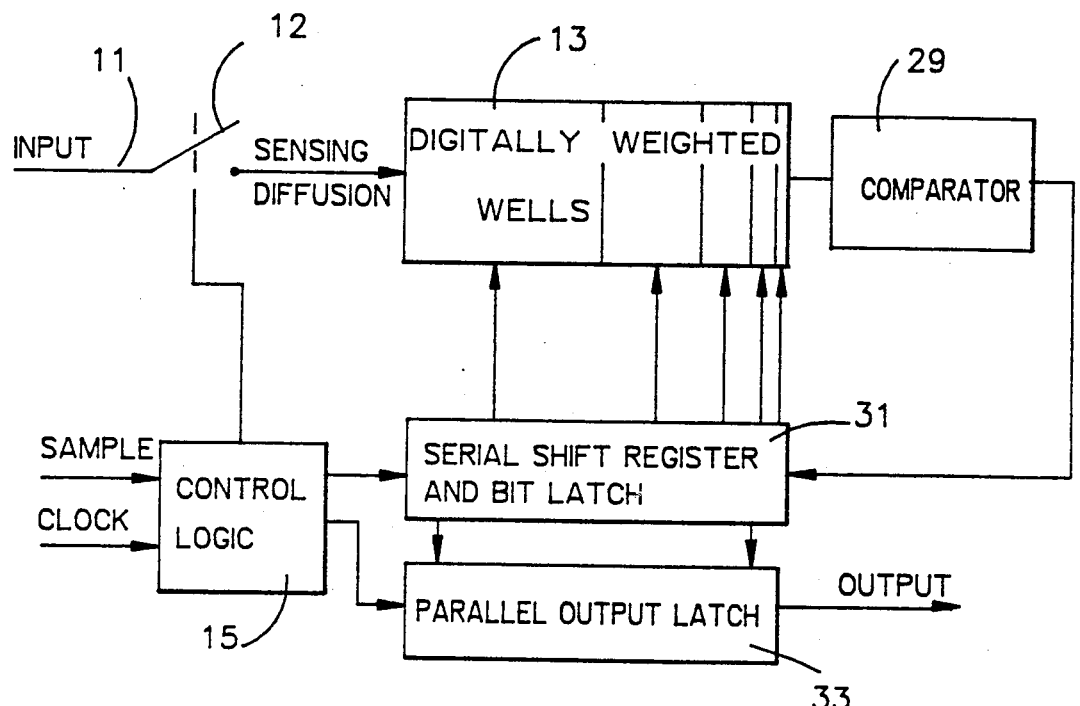
FIG. 3 is a system block diagram of an analog to digital conversion apparatus incorporating the invention.

Referring to FIG. 3, an overall system block diagram for an analog to digital converter incorporating the invention is shown. The analog signal charge packet is received at the charge input 11. sampled into the A/D at the correct time by the sampling switch 12, and applied to the digitally weighted charge storage wells 13. When a charge packet from a CCD or other charge source is input, the diffusion must be reset to a fixed voltage prior to charge arrival.

The operation of the sampling switch 12, as well as certain other elements of the system, is controlled by control logic 15. The control logic is conventional in construction.

The charge packet could also have been sampled from an input diffusion and applied to the digitally weighted charge storage wells, in which case it is directly proportional to a sampled signal equivalent voltage. The charge packet from a previous analog to digital conversion need not be cleared from the charge wells, as the charge stored will equilibrate to the new sampled value.

Figure 4:
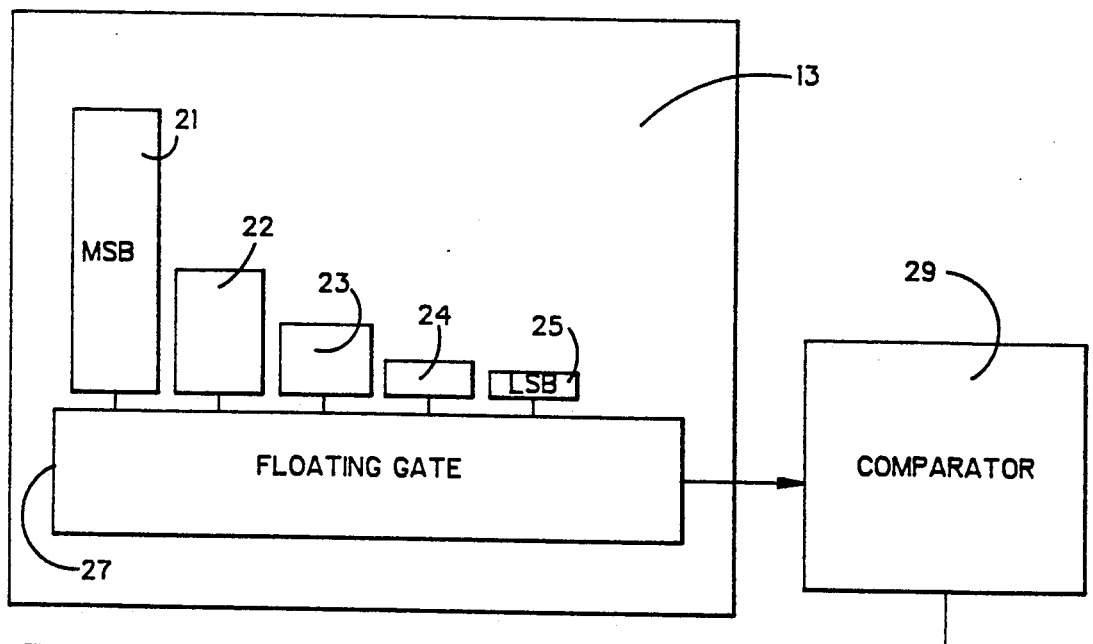
FIG. 4 is a block diagram of the analog to digital converter constructed according to the invention.

The digitally weighted charge storage wells 13 are shown in greater detail in the block diagram of FIG. 4. The embodiment illustrated is for producing a 5-bit digital value. Those skilled in the art will recognize that the apparatus can be expanded or reduced for different numbers of digital bits.

The A/D includes a plurality of charge storage elements or charge storage wells 21–25. The charge storage wells are controlled by storage gates. Each charge storage well has a predetermined charge volume. The volume of each well is determined by the area of the charge storage gate on the die and the voltage applied to the gate when creating a storage well. Each well can be caused to either hold charge (store or receive charge) or expel charge (unload charge). Whether the well is in the charge receive or the charge expel mode depends on the voltage applied to the gate.

In addition, there is a predetermined charge volume relationship among the different wells that corresponds to the relationship among the bit values in the converted digital representation. In the preferred embodiment shown for generating a binary digital result, each well is constructed to hold half the charge of the preceding well. Thus, the first well 21 holds a predetermined amount of charge. The second well 22 holds one-half the charge that the first well holds the third well 23 holds one-half the charge that the second well holds, and so forth. In the illustrated embodiment, the voltage applied to the gates is the same, so the volume differences are obtained by varying the areas of the gates. Thus, the second gate for the second well 22 has one-half the area of the first gate of the first well 21, the third gate of the third well 23 has one-half the area of the second gate, and so forth.

The number of gates and wells corresponds to the number of bits desired in the digital representation of the signal. The largest well corresponds to the most significant bit of the digital result, the second largest well corresponds to the next most significant bit, and so forth, with the smallest well corresponding to the least significant bit.

All of the charge storage wells are connected to a floating gate or common sensing diffusion 27. This floating gate forms the sensing element for a charge-based comparator 29. The comparator is conventional in construction, and compares the charge on the floating gate with a threshold to determine if an overflow condition exists.

Figure 6:
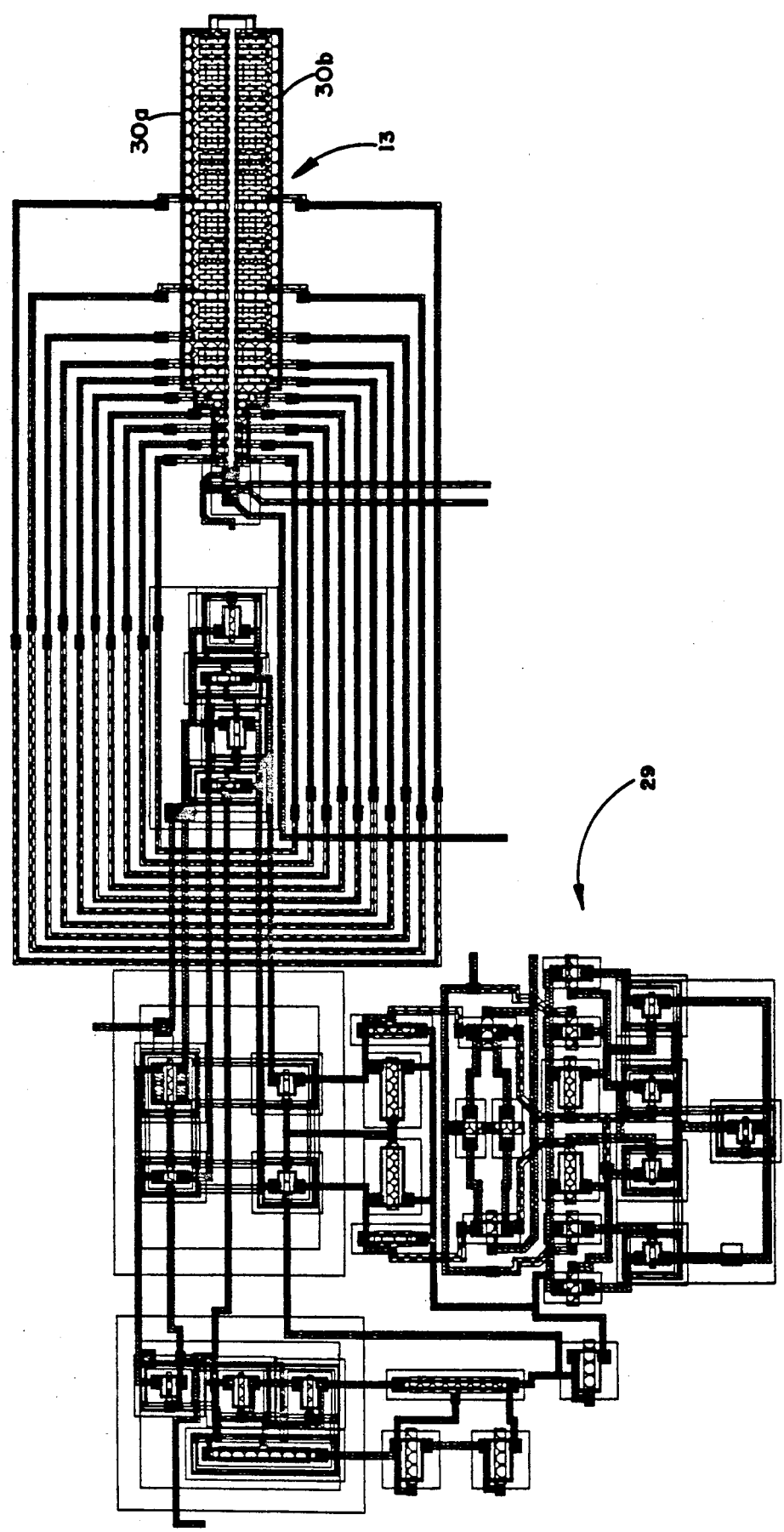
FIG. 6 is a layout diagram of an analog to digital converter according to the invention.

The structure shown in block diagram form in FIGS. 3 and 4 may be implemented on a semiconductor die. An exemplary multi-layer layout of the weighted A/D 13 and the comparator 29 is shown in FIG. 6. The weighted A/D shown includes ten charge storage gates, for generating a ten bit digital output. In the illustrated layout, each gate is formed in two halves, as illustrated for example by the largest charge storage gate 30, which is formed of halves 30a and 30b. The split charge storage gates provide greater control over the size and positioning of the gates. Those skilled in the art will recognize that the size ratios among the gates are important to accurate generation of the digital bits. With the exception of the comparator, the entire structure can be formed using an all digital CMOS design.

In operation, the charge storage wells 21–25 are initially set to a voltage that will expel all charge from the gate, to empty the gates of any residual charge. The floating gate 27 is reset to a predetermined starting voltage.

The charge storage elements 21–25 are then all set in the charge store mode by adjusting the voltage applied to the charge storage gates.

The signal, in the form of a packet of charge that is directly proportional to a sampled signal equivalent voltage is input to the floating gate 27, and through the floating gate to the charge storage gates 21–25. Because of the common connection of the charge storage gates to the floating gate, the charge is distributed proportionally among the charge storage wells.

Conversion of this received analog charge to a digital value begins with the most significant binary bit (MSB). The voltage applied to the first charge storage gate (the MSB well) 21 is adjusted to change the first, MSB well from the charge store mode to the charge expel mode, and expel all the charge from the first gate onto the floating gate and the other charge storage gates 22–25. The charge on the common diffusion exceeds the threshold of the comparator when the charge in the storage gates exceeds a particular level.

The comparator 29 then samples the state of the floating gate 27, to determine if the preset threshold of charge on the floating gate has been exceeded.

Figure 1:
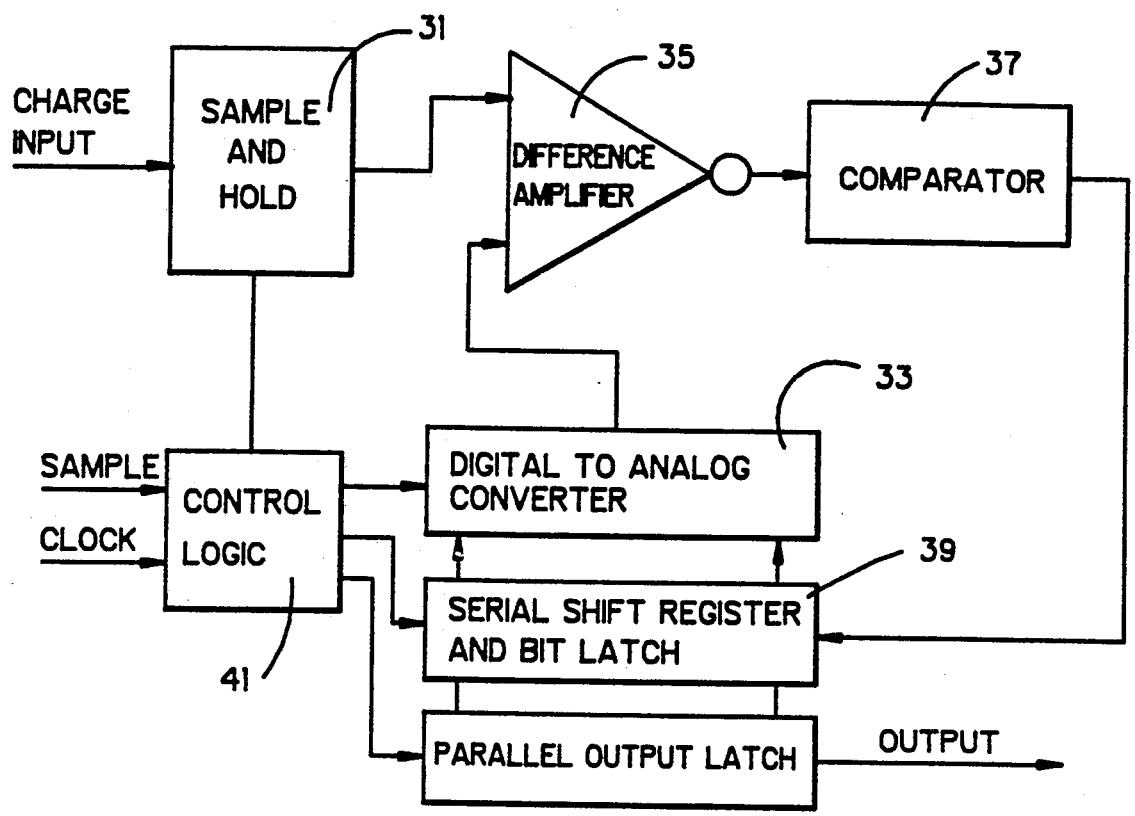
FIG. 1 is a system block diagram of a conventional successive approximation analog to digital converter.

If the threshold is not exceeded, a "0" is recorded in the memory 31 (FIG. 1) for the most significant bit, and the first storage gate 21 is left in the charge expel mode for the remainder of the conversion process.

If the comparator detects that the charge on the floating gate has exceeded the threshold, a digital "1" is recorded in the bit latch and serial shift register 31 (FIG. 1), and the first gate is reset to the charge hold or store mode.

Next, the second gate 22 is changed to the charge expel mode to begin the process of determining the second or next most significant bit in the digital representation. In the charge expel mode, the second gate discharges or unloads charge onto the sensing diffusion 27 and the other smaller charge storage gates 23-25. Whether the charge goes onto the first (MSB) charge storage gate 21 depends on the output of the first comparison. If 13 the first comparison produced a digital "0", and the gate was thus left in the charge expel mode, no charge will be stored on the first gate. But, if the first comparison produced a digital "1", and the gate reset to the charge store mode, charge from the second gate will be stored on the first gate as well as the other gates 23-25.

Each of the gates receives the additional charge from the second gate in proportion to the size of the gate.

The comparator attached to the common diffusion is again sampled. As before, if the comparator attached to the diffusion by an overflow condition on the floating gate, a "0" is not set by an overflow condition on the floating gate, a "0" is recorded in the shift register bit latch 31 for the second most significant bit, and the second gate 22 is left in the charge expel mode. If, however, the comparator is set by an overflow condition on the gate, a "1" is recorded in the bit latch for the second most significant bit and a second gate is reset to the charge storage mode.

The process of expelling charge from the successive gates, sensing the status of the floating gate with the comparator, and recording digital values in the bit latch is continued for each successive gate, until all the desired digital bits have been generated. The digital data may be output serially as the A/D converter progresses, or may be output in serial or parallel form from the bit latch at the conclusion of the conversion process.

Figure 2:
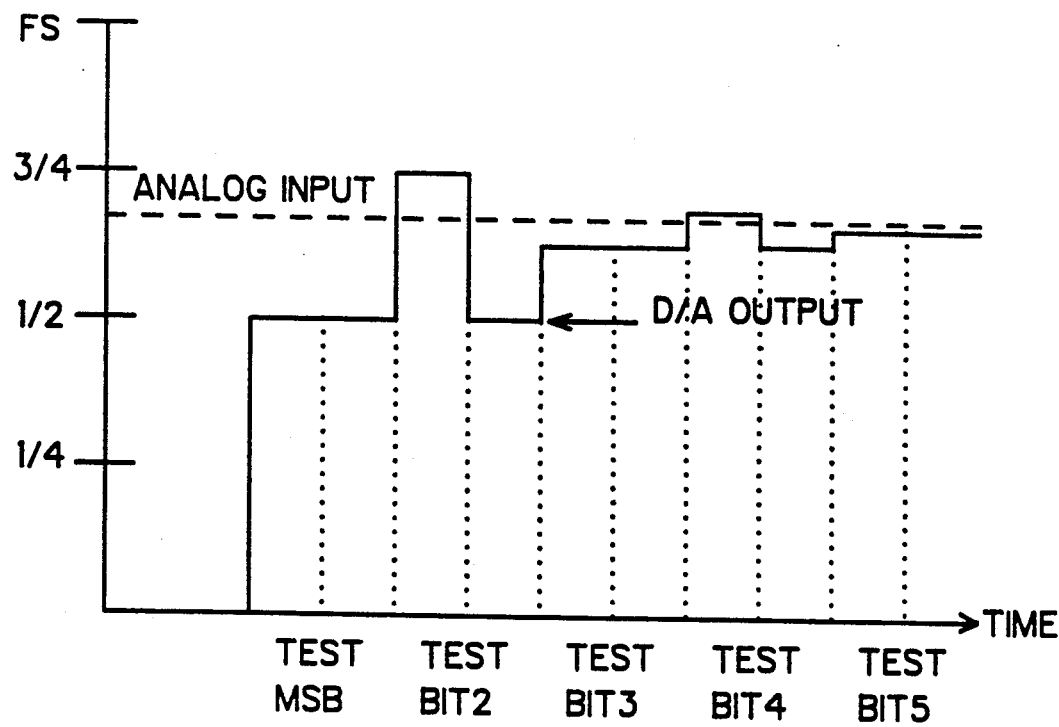
FIG. 2 a bit weighting scheme for a conventional five bit analog to digital converter.
Figure 5:
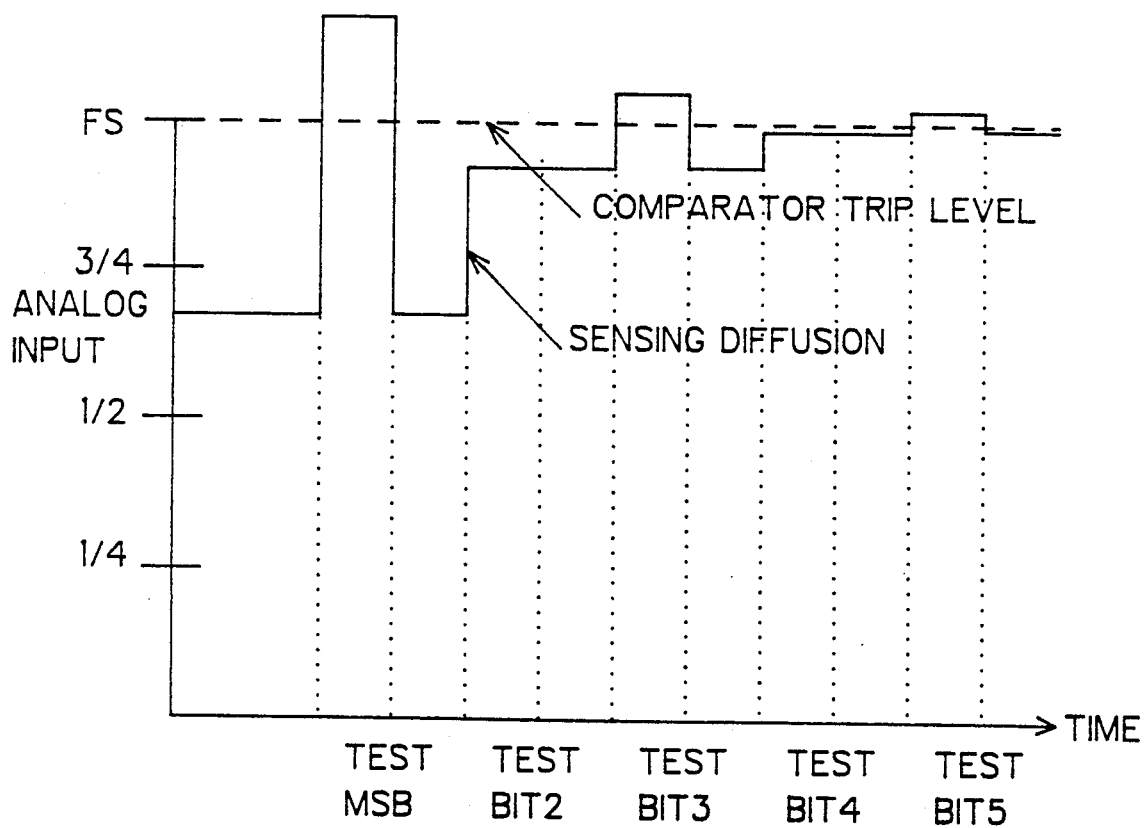
FIG. 5 shows the bit weighting scheme for a five bit analog to digital converter constructed according to the invention.

FIG. 5 shows a bit weighing scheme of the charge domain analog to digital converter for producing a five bit output. The gate forming the MSB well 21 is caused to unload charge onto the rest of the gates and the sensing diffusion. The comparator, attached to the diffusion, is then sampled for status. In this example a "1" was recorded for the MSB. The operation of conversion continues with each gate in binary order from the MSB to the least significant bit (LSB). Each gate is successively interrogated, comparator status stored in memory, and left unloaded or returned to the hold charge condition dependent on the status of the comparator. The second bit therefore was a "0", the third a "1", the fourth a "0", and the fifth a "1". The resultant binary output code was 10101. This was the same result as in the example of the conventional analog to digital converter in FIG. 2.

Successive approximation of data requires a finite period of time for each bit. As each data bit is used in determining the next bit, the completed conversion is preferably transferred to a separate output shift register or parallel output latch 33. The converter may then be cleared and made ready for the next signal charge packet. In this way, the completed conversion can be output at any convenient time during the next conversion cycle. This output can be in either serial or parallel form.

The construction of the charge based comparator 29, the serial shift register and bit latch 31 and the output register 33, as well as the control logic 15 and other selection electronics for controlling the operation of the charge-based analog to digital converter are known in the art, and will be apparent to those skilled in the art.

FIG. 6 shows the die layout of a particular embodiment of the analog to digital converter of the invention. In particular, the individual gates forming the digitally weighted charge storage wells 13 are seen.

The invention may be embodied in other specific forms without departing from its spirit. The above-described embodiment is therefore to be considered as illustrative and not restrictive, the scope of the invention being defined by the following claims and their equivalents.

I claim:

1. A method of converting an analog signal to a digital representation comprising first through Nth bits, with the first bit being the most significant bit, the digital representation including a kth bit, the method comprising:
   (a) setting first through Nth charge storage gates, including a kth gate, in a charge accept mode, wherein each of said charge storage gates has a charge accept mode and a charge expel mode.,
   (b) receiving a charge packet representative of a signal amplitude;
   (c) storing said charge packet proportionately in said gates;
   (d) setting said kth gate in the charge expel mode and expelling the charge from said kth gate onto a sensing diffusion connected to said gates and onto others of said gates;
   (e) detecting whether said sensing diffusion is in a first condition or a second condition;
   (f) if said sensing diffusion is in said first condition, recording a "0" for the kth bit of said digital representation, and holding said kth gate in said charge expel mode; and
   (g) if said sensing diffusion is in said second condition, recording a "1" for the kth bit of said digital representation and resetting said kth gate to said charge accept mode.

2. The method of claim 1, wherein said step of expelling the charge from said kth gate onto said sensing diffusion and others of said gates comprises expelling said charge onto the ones of said gates that are in the charge accept mode.

3. The method of claim 1, wherein said step of expelling the charge from said kth gate onto said sensing diffusion and others of said gates comprises expelling said charge onto the $(k+1)$th through Nth gates, and onto those gates of said first through $(k-1)$th gates that are in the charge accept mode.

4. The method of claim 3, wherein said first bit of said digital representation is the most significant bit of said digital representation, and said Nth bit is the least significant bit of said digital representation, and wherein k is initially set to "1", and said method additionally comprises successively repeating steps (d) through (g) and incrementing by 1 each repetition.

5. The method of claim 4, wherein said kth gate is retained in the charge expel or charge hold state determined in steps (f) and (g) through repetitions $k+1$ through N.

6. The method of claim 5, wherein said $(k-1)$th gate has twice the capacity of said kth gate, and said kth gate has twice the capacity of said $(k+1)$th gate.

7. A method of converting an analog signal to a digital representation comprising a plurality of bits, the method comprising:

(a) receiving a charge packet representative of a signal amplitude;

(b) storing said charge packet in a plurality of charge storage wells, each having a predetermined relative storage capacity, wherein said charge is distributed proportionately among said charge storage wells;

(c) unloading the charge from a first of said charge storage wells onto the other of said charge storage wells and onto a sensing diffusion connected to said charge storage wells;

(d) sampling a comparator connected to said sensing diffusion;

(e) if said comparator senses a first condition in said sampling step:
recording a "0" for the first bit of the digital representation; and
unloading the charge from a second of said storage wells onto said other charge storage wells, but not onto said first charge storage well;

(f) if said comparator senses a second condition in said sampling step:
recording a "1" for said first bit., and
unloading the charge from said second storage well onto other charge storage wells, including said first storage well;
sampling said comparator a second time;

(g) if said comparator senses said first condition in said second sampling step, recording a "0" for the second bit of the digital signal representation; and (h) if said comparator senses said second condition in said second sampling step, recording a "1" for the second bit of the digital signal representation.

8. The method of claim 7, wherein:
said step of unloading the charge from said first charge storage well comprises setting said first charge storage well in a charge expel mode and retaining the others of said charge storage wells in a charge storage mode;
said step of unloading the charge from said second storage well onto said other charge storage wells, but not onto said first charge storage well comprises retaining said first charge storage well in said charge expel mode, setting said second charge storage well in said charge expel mode, and retaining the others of said charge storage wells in said charge storage mode; and
said step of unloading the charge from said second storage well onto the other charge storage wells including said first storage well comprises setting said second charge storage well in said charge expel mode, and retaining the others of said charge storage wells, including said first storage well, in said charge storage mode.

9. The method of claim 8, wherein said first bit is the most significant bit of said digital representation, and said second bit is the next-most significant bit of said digital representation.

10. The method of claim 9, wherein said plurality of bits comprises first through Nth bits, and said plurality of charge storage wells comprises first through Nth charge storage wells.

11. The method of claim 10, wherein said first well has twice the capacity of said second well, said second well has twice the capacity of said third well, and said (N−1)th well has twice the capacity of said Nth well.

12. The method of claim 11, additionally comprising:
setting said (N−1)th well in the charge expel mode and expelling the charge stored in said (N−1)th well onto said sensing diffusion, said Nth well, and any of said other wells that are in the charge accept mode;
comparing the charge on said sensing diffusion with a threshold;
if said comparison step determines that said sensing diffusion is in a first condition, recording a "0" for the (N−1)th most significant bit of said digital representation;
if said second comparison step determines that said sensing diffusion is in a second condition, recording a "1" for the (N−1)th most significant bit of said digital representation.

13. An analog to digital converter comprising:
a plurality of charge storage elements, each having a charge receive mode and a charge expel mode, wherein each of said charge storage elements is configured for storing a predetermined amount of charge, and wherein said charge storage elements are connected to proportionately receive charge corresponding to a sampled input voltage;
a comparator including a sensing diffusion, wherein said sensing diffusion is connected to all of said charge storage elements, and wherein said comparator produces a "0" bit if said sensing diffusion is in a first condition and a "1" bit if said sensing diffusion is in a second condition;
selection means connected to said charge storage elements for selectively setting individual ones of said charge storage elements in said charge receive mode or said charge expel mode; and
sampling means connected to said comparator for selectively sampling the output of said comparator.

14. The analog to digital converter of claim 13, wherein:
said plurality of charge storage elements comprises first through Nth charge storage elements; and
said first charge storage element is configured for storing twice as much charge as said second charge storage element and said second charge storage element is configured for storing twice as much charge as said third charge storage element.

15. The analog to digital converter of claim 14, wherein:
said selection means sets said first charge storage element in the charge expel mode and leaves said other charge storage elements in the charge storage mode to generate the most significant bit of said digital value; and
said selection means sets said second charge storage element in the charge expel mode to generate the next-most significant bit of said digital value.

16. The analog to digital converter of claim 14, wherein:
said selection means sets said first charge storage element in the charge expel mode and leaves said other charge storage elements in the charge storage mode to generate the most significant bit of said digital value; and
said selection means sets the Nth charge storage element in the charge expel mode to generate the Nth most significant bit of said digital value, and sets said (N−1)th charge storage element in the charge expel mode if said (N−1)th most significant bit of said digital value is recorded as a 0, and sets said (N−1)th charge storage element in the charge storage mode if said (N−1)th most significant bit of said digital value is recorded as a 1.

17. An analog to digital converter comprising:
first through Nth charge storage elements, wherein a first charge storage element is configured to store twice as much charge as a second charge storage element, and said second charge storage element is configured to store twice as much charge as a third charge storage element wherein each of said charge storage elements has a charge receive mode and a charge expel mode;
a comparator including a sensing diffusion, wherein said sensing diffusion is connected to all of said charge storage elements, and wherein said comparator produces a "0" bit if said sensing diffusion is in a first condition and a "1" bit if said sensing diffusion is in a second condition;
selection means connected to said charge storage elements for selectively setting individual ones of said charge storage elements in said charge receive mode or said charge expel mode; and
sampling means connected to said comparator for selectively sampling the output of said comparator.

18. The analog to digital converter of claim 17, wherein:
said selection means sets said first charge storage element in the charge expel mode and leaves said other charge storage elements in the charge storage mode to generate the most significant bit of said digital value; and
said selection means sets said second charge storage element in the charge expel mode to generate the next-most significant bit of said digital value.

* * * * *